United States Patent
Okamoto et al.

(10) Patent No.: US 8,461,450 B2
(45) Date of Patent: Jun. 11, 2013

(54) SOLAR CELL MODULE AND MANUFACTURING METHOD OF SOLAR CELL MODULE

(75) Inventors: Shingo Okamoto, Toyonaka (JP); Masayuki Aou, Kaizuka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 451 days.

(21) Appl. No.: 12/721,882

(22) Filed: Mar. 11, 2010

(65) Prior Publication Data

US 2010/0229918 A1   Sep. 16, 2010

(30) Foreign Application Priority Data

Mar. 13, 2009 (JP) ................................. 2009-062110

(51) Int. Cl.
*H01L 31/042* (2006.01)
*H02N 6/00* (2006.01)

(52) U.S. Cl.
USPC ........................................................ 136/251

(58) Field of Classification Search
USPC .................. 136/244, 251, 252, 256
See application file for complete search history.

(56) References Cited

U.S. PATENT DOCUMENTS

| | | | |
|---|---|---|---|
| 6,294,724 B1 * | 9/2001 | Sasaoka et al. | 136/251 |
| 6,380,478 B1 * | 4/2002 | Yamamoto et al. | 136/244 |

FOREIGN PATENT DOCUMENTS

| | | | |
|---|---|---|---|
| EP | 2015370 A2 * | 1/2009 | |
| JP | 05-082820 A | 4/1993 | |
| JP | 2001024205 A * | 1/2001 | |
| JP | 2001274440 A * | 10/2001 | |

* cited by examiner

*Primary Examiner* — Jennifer Michener
*Assistant Examiner* — Eli Mekhlin
(74) *Attorney, Agent, or Firm* — Marvin A. Motsenbocker; Mots Law, PLLC (57) ABSTRACT

A manufacturing method of a solar cell module includes a rear-surface-side protection member having a metal layer sandwiched between a plurality of resin layers, the method comprising the steps of: forming a pair of first slits and a second slit in the rear-surface-side protection member to form a pair of movable portions on both sides of the second slit, the second slit extending between and communicating with the pair of the first slits; opening each of the pair of movable portions; performing an insulating treatment on at least a part of the metal layer exposed to the surface of each of the pair of movable portions; and sealing a solar cell between a light-receiving-surface-side protection member and the rear-surface-side protection member, wherein one end portion of an output lead is drawn out from between the pair of movable portions, the output lead being configured to draw electric power from the solar cell.

4 Claims, 6 Drawing Sheets

SOLAR CELL MODULE AND MANUFACTURING METHOD OF SOLAR CELL MODULE

CROSS REFERENCE TO RELATED APPLICATIONS

This application is based upon and claims the benefit of priority from prior Japanese Patent Application No. 2009-062110, filed on Mar. 13, 2009; the entire contents of which are incorporated herein by reference.

BACKGROUND OF THE INVENTION

1. Field of the Invention

The present invention relates to a manufacturing method of a solar cell module including an output lead configured to draw electric power from the solar cell.

2. Description of the Related Art

A solar cell is expected as a new energy source because the solar cell directly converts clean and inexhaustibly supplied sunlight into electricity. Generally, in order to increase the weather resistance of the solar cell, the solar cell is sealed with a sealing member between a light-receiving-surface-side protection member and a rear-surface-side protection member.

Electric power generated by the solar cell is drawn to the outside of the solar cell module by an output lead connected to the solar cell. Specifically, the output lead is drawn out to the outside of the solar cell module through a linear slit formed in the rear-surface-side protection member (for example, refer to Japanese Patent Application Publication No. Hei 5-82820).

As the rear-surface-side protection member, there is widely used a laminated film which is formed in a sheet shape by sandwiching a metal layer such as aluminum layer between resin layers (for example, refer to Japanese Patent Application Publication No. Hei 5-82820). The moisture resistance and gas barrier property of the solar cell module can be improved by using such rear-surface-side protection member.

When the above-mentioned laminated film is used as the rear-surface-side protection member, a metal layer is exposed to the inner side of the slit in the rear-surface-side protection member. Thus, in order to provide electrical insulation between the output lead and the metal layer, the output lead is generally covered with an insulating film.

However, since the insulating film and the metal layer are in direct contact with each other, the electrical insulation between the output lead and the metal layer may not be secured if the solar cell module has a high output.

The invention is made in view of the above-mentioned circumstances, and it is an object of the invention to provide a manufacturing method of a solar cell module capable of securing electrical insulation between a metal layer of a rear-surface-side protection member and an output lead.

SUMMARY OF THE INVENTION

An aspect of the present invention is summarized as a manufacturing method of a solar cell module including a rear-surface-side protection member having a metal layer sandwiched between a plurality of resin layers, the method comprising the steps of forming a pair of first slits and a second slit in the rear-surface-side protection member to form a pair of movable portions on both sides of the second slit, the second slit extending between and communicating with the pair of the first slits; opening each of the pair of movable portions; performing an insulating treatment on at least a part of the metal layer exposed to the surface of each of the pair of movable portions; and sealing a solar cell between a light-receiving-surface-side protection member and the rear-surface-side protection member, wherein one end portion of an output lead is drawn out from between the pair of movable portions, the output lead being configured to draw electric power from the solar cell.

In the above aspect of the present invention, the manufacturing method of the solar cell module may include the step of performing the insulating treatment, the metal layer exposed to the surface of each of the pair of movable portions is covered with an insulation tape.

Another aspect of the present invention is summarized as a solar cell module comprising: a light-receiving-surface-side protection member, a rear-surface-side protection member having a metal layer sandwiched between a plurality of resin layers, a plurality of solar cells arranged between the light-receiving-surface-side protection member and the rear-surface-side protection member, and an output lead drawing the electric power generated by the plurality of solar cells to the outside thereof, wherein the rear-surface-side protection member includes a first portion partially surrounded by a slit and a second portion partially surrounded by a slit, the output lead is drawn out from between the first portion and the second portion, and an insulating member is located between the output lead and a part of an outer circumference of the first portion facing to the output lead, and between the output lead and a part of an outer circumference of the second portion facing to the output lead.

In the above aspect of the present invention, the insulating member may be an insulation tape.

In the above aspect of the present invention, the insulation tape may be attached across the light-receiving-surface-side of the rear-surface-side protection member through the rear-surface-side thereof.

In the above aspect of the present invention, the slit surrounding the first portion partially may include a plurality of linear slits.

In the above aspect of the present invention, the slit surrounding the second portion partially may include a plurality of linear slits.

In the above aspect of the present invention, the solar cell module may include an internal separation member between the plurality of solar cells and the rear-surface-side protection member.

DETAILED DESCRIPTION OF THE EMBODIMENTS

Next, an embodiment of the invention is described with reference to the drawings. In the following description of the drawings, identical or similar reference numerals are given to identical or similar components. However, the drawings are only schematic, thus it should be noted that the ratios of dimensions are not shown to scale. Accordingly, specific dimensions should be recognized in consideration of the following description. Also, there are inevitably included some portions of the drawings between which a dimensional relationship and/or a scale are inconsistent.

[First Embodiment]
[Schematic Structure of Solar Cell Module]

Figure 1:
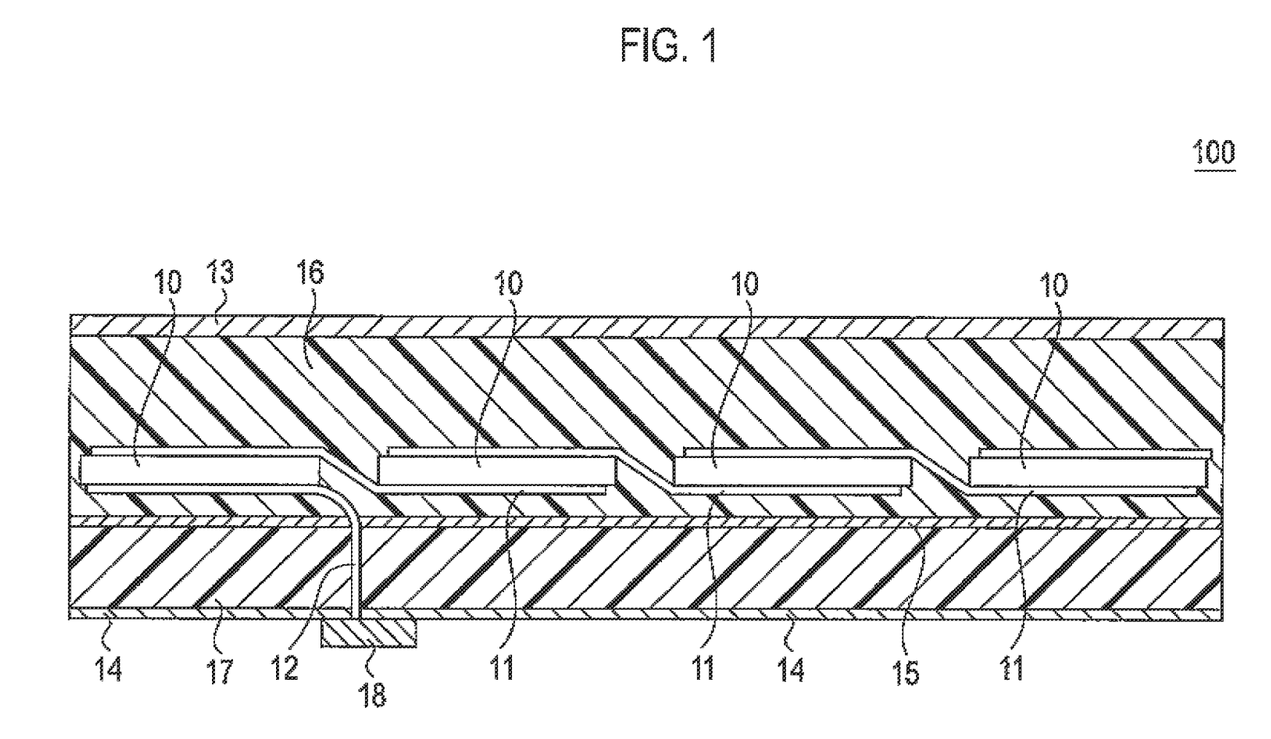
FIG. 1 is a side view of a solar cell module 100 according to an embodiment of the invention.

The schematic structure of a solar cell module 100 according to the embodiment of the invention is described with reference to FIG. 1. FIG. 1 is a side view of the solar cell module 100 according to the embodiment of the invention.

As shown in FIG. 1, the solar cell module 100 includes a plurality of solar cells 10, a plurality of connecting members 11, an output lead 12, a light-receiving-surface-side protection member 13, a rear-surface-side protection member 14, an internal separation member 15, a first sealing member 16, a second sealing member 17, and a terminal box 18. The solar cell module 100 is configured by sealing the plurality of solar cells 10 between the light-receiving-surface-side protection member 13 and the rear-surface-side protection member 14.

The plurality of solar cells 10 are arranged in a matrix form between the light-receiving-surface-side protection member 13 and the rear-surface-side protection member 14. The plurality of solar cells 10 are electrically connected by the plurality of connecting members 11. Each of the solar cells 10 has a light receiving surface to receive light and a rear surface provided on the opposite side of the solar cell 10 from the light receiving surface. Although not shown, there are provided in each solar cell 10, a photoelectric conversion body which generates a carrier by receiving light on the light receiving surface, and a pair of positive and negative electrodes configured to draw the career from the photoelectric conversion body.

Each of the plurality of connecting members 11 is connected to the electrode formed on the light receiving surface of one solar cell 10, and the electrode formed on the rear surface of the other solar cell 10 adjacent to the one solar cell 10. Thereby, one solar cell 10 and the other solar cell 10 are electrically connected to each other. Each connecting member 11 is preferably composed of a thin plate or a twisted wire of a low electrical resistance material such as copper, silver, gold, tin, nickel, aluminum, or an alloy of these. The surface of each connecting member 11 may be covered with a conductive material such as lead-free solder (e.g., $SnAg_{3.0}Cu_{0.5}$ solder).

The output lead 12 is a wiring member configured to draw the electric power generated by the plurality of solar cells 10 to the outside thereof. One end of the output lead 12 is electrically connected to an electrode of at least one solar cell 10. The other end of the output lead 12 is drawn out to the outside of the solar cell module 100 from the rear-surface-side protection member 14, and is housed in the terminal box 18. Although not shown, a pair of positive and negative output leads is generally provided in the solar cell module 100.

Similarly to the connecting member 11, the output lead 12 is preferably composed of a low electrical resistance material. Also, the output lead 12 is preferably covered with an insulating film, but the invention is not limited to this case.

The light-receiving-surface-side protection member 13 is disposed on the light-receiving-surface-side of the plurality of solar cells 10. The light-receiving-surface-side protection member 13 protects the surface of the solar cell module 100. As the light-receiving-surface-side protection member 13, a glass which is translucent and impervious to water or translucent plastic can be used.

The rear-surface-side protection member 14 is disposed on the rear-surface-side of the plurality of solar cells 10. The rear-surface-side protection member 14 protects the rear surface of the solar cell module 100. The rear-surface-side protection member 14 according to the embodiment has a structure in which a metal layer is sandwiched between two resin layers. The rear-surface-side protection member 14 has a slit through which the other end of the output lead 12 is drawn out to the outside of the solar cell module. The configuration of the rear-surface-side protection member 14 is described below.

The internal separation member 15 separates the inside of the solar cell module 100 into two parts. The internal separation member 15 has a function to prevent water from penetrating into the plurality of solar cells 10 from the rear-surface-side protection member 14. The output lead 12 is inserted through the internal separation member 15. As the internal separation member 15, a resin film such as a PET film, can be used.

The first sealing member 16 seals the plurality of solar cells 10 between the light-receiving-surface-side protection member 13 and the internal separation member 15. The second sealing member 17 is charged into between the rear-surface-side protection member 14 and the internal separation member 15. As the first sealing member 16 and the second sealing member 17, translucent resin such as EVA, EEA, PVB, silicon, urethane, acryl, and epoxy can be used. The first sealing member 16 and the second sealing member 17 may be composed of the same material, or different materials with each other.

The terminal box 18 is disposed on the rear-surface-side protection member 14. The other end of the output lead 12 is housed in the terminal box 18.

An aluminum frame may be mounted on the outer circumference of the solar cell module 100 which has the above configuration.

[Configuration of Rear-Surface-Side Protection Member]

Figure 2:
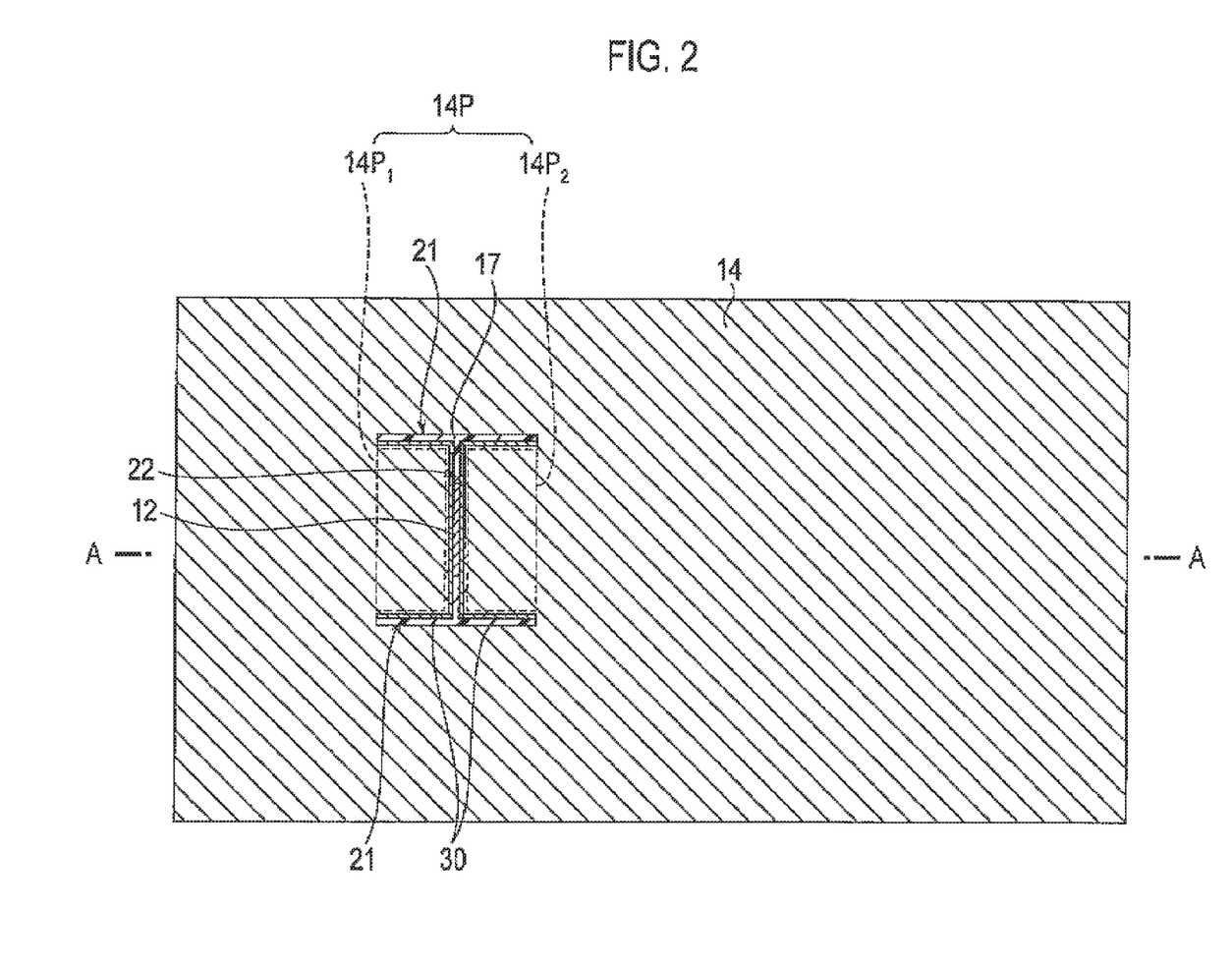
FIG. 2 is a plan view from the rear-surface-side protection member 14 of the solar cell module 100 according to the embodiment of the invention.
Figure 3:
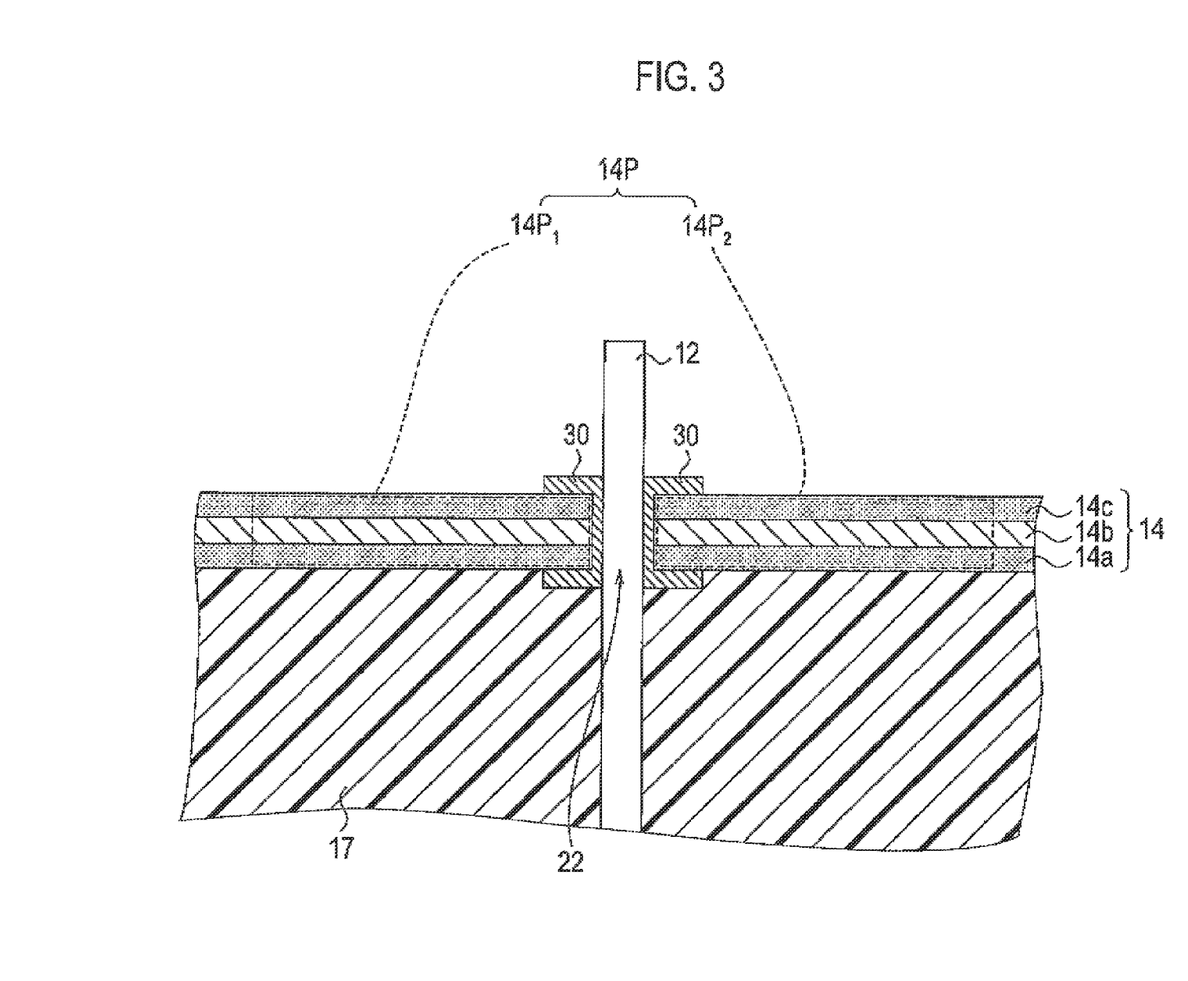
FIG. 3 is a cross-sectional view taken along the line A-A of FIG. 2.

Next, the configuration of the rear-surface-side protection member 14 is described with reference to FIGS. 2 and 3. FIG. 2 is a plan view from the rear-surface-side protection member 14 of the solar cell module 100 according to the embodiment of the invention. FIG. 3 is a cross-sectional view taken along the line A-A of FIG. 2. FIG. 2 is shown with the terminal box 18 removed for the clarity of the configuration of the rear-surface-side protection member 14.

As shown in FIG. 2, the rear-surface-side protection member 14 includes a pair of first slits 21, a second slit 22, a pair of movable portions 14P, and an insulation tape 30.

Each of the pair of the first slits 21 is a groove which passes through the rear-surface-side protection member 14.

The second slit 22 is a groove which passes through the rear-surface-side protection member 14. The second slit 22 extends between the pair of the first slits 21 and communicates with the pair of the first slits 21. One end portion of the output lead 12 is drawn out from the second slit 22.

The pair of movable portions 14P is formed on both sides of the second slit 22. The output lead 12 is drawn out between the pair of movable portions 14P. After the solar cell module 100 is completed, the pair of movable portions 14P is no longer movable because the pair is bonded to the second sealing member 17. As described below, the pair of movable portions 14P is movable (can be opened and closed) during a manufacturing process of the solar cell module 100.

As shown in FIG. 2 and FIG. 3, the rear surface-side protection member 14 includes a first portion $14P_1$ partially surrounded by a slit and a second portion $14P_2$ partially surrounded by a slit. Specifically, the rear-surface-side protection member 14 includes the first portion $14P_1$ and the second portion $14P_2$ partially surrounded by the pair of first slits 21 and the second slit 22. Therefore, the slit surrounding the first portion $14P_1$ partially includes a plurality of linear slits. The slit surrounding the second portion $14P_2$ partially includes a plurality of linear slits. The pair of movable portions 14P corresponds to the first portion $14P_1$ and the second portion $14P_2$.

The insulation tape 30 is provided along each of the respective outer circumferences of the pair of movable portions 14P. Here, the output lead 12 is drawn out from between the first portion $14P_1$ and the second portion $14P_2$. Therefore, As shown in FIG. 2 and FIG. 3, the insulation tape 30 is located between the output lead 12 and a part of an outer circumference of the first portion $14P_1$ facing to the output lead 12, and between the output lead 12 and a part of an outer circumference of the second portion $14P_2$ facing to the output lead 12. The insulation tape 30 is an adhesive tape provided with an adhesive material on a surface thereof facing a corresponding one of the pair of movable portions 14P.

The rear-surface-side protection member 14 has a metal layer sandwiched between a plurality of resin layers. Specifically, as shown in FIG. 3, the rear-surface-side protection member 14 includes a first resin layer 14a, a metal layer 14b, and a second resin layer 14c. The metal layer 14b is sandwiched between the first resin layer 14a and the second resin layer 14c. The first resin layer 14a and the second resin layer 14c are sheet-like resin films such as a PET film, for example. The metal layer 14b is an aluminum foil, for example.

In the embodiment, the insulation tape 30 is attached across the light-receiving-surface-side of the rear-surface-side protection member 14 through the rear-surface-side thereof. In this manner, the insulation tape 30 covers the surfaces of the pair of movable portions 14P, which face to the second slit 22. It should be noted that only the metal layer 14b portion which come into contact with the output lead 12 may be covered by the insulation tape 30.

[Manufacturing Method of Solar Cell Module]

Next, a manufacturing method of the solar cell module 100 is described with reference to the drawings.

Figure 4:
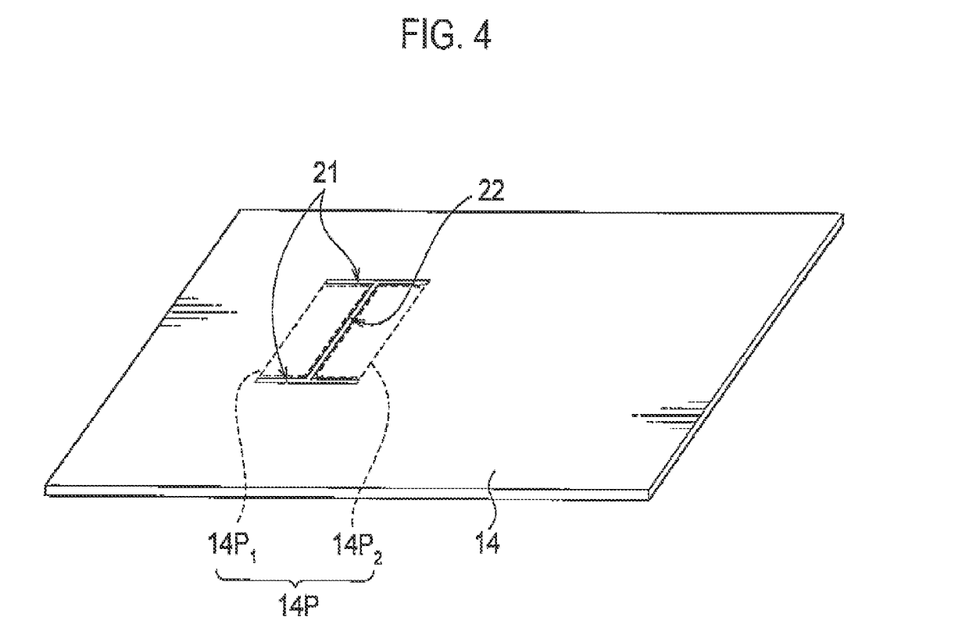
FIG. 4 is a perspective view to illustrate a manufacturing method of the solar cell module 100 according to the embodiment of the invention.

First, as shown in FIG. 4, the pair of the first slits 21 and the second slit 22 are formed in the rear-surface-side protection member 14. Consequently, the pair of movable portions 14P is formed on both sides of the second slit 22.

Figure 5:
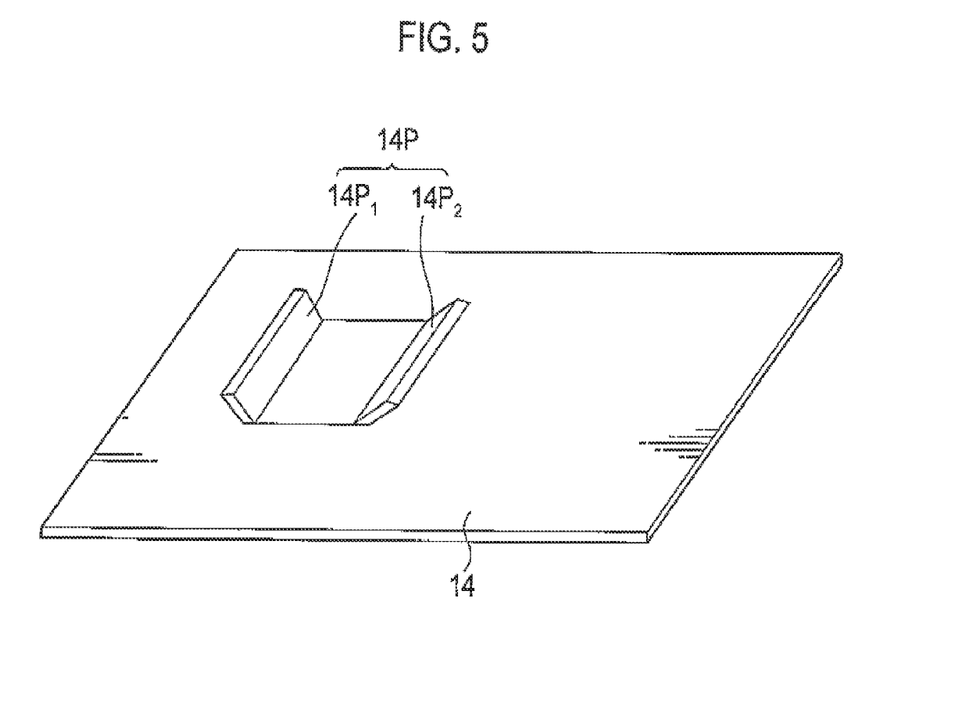
FIG. 5 is another perspective view to illustrate a manufacturing method of the solar cell module 100 according to the first embodiment of the invention.

Next, as shown in FIG. 5, each of the pair of movable portions 14P is opened. In the shown embodiment, both of the pair of movable portions 14P are opened outward, but the invention is not limited to this embodiment. The pair of movable portions 14P may be opened in opposite directions.

Figure 6:
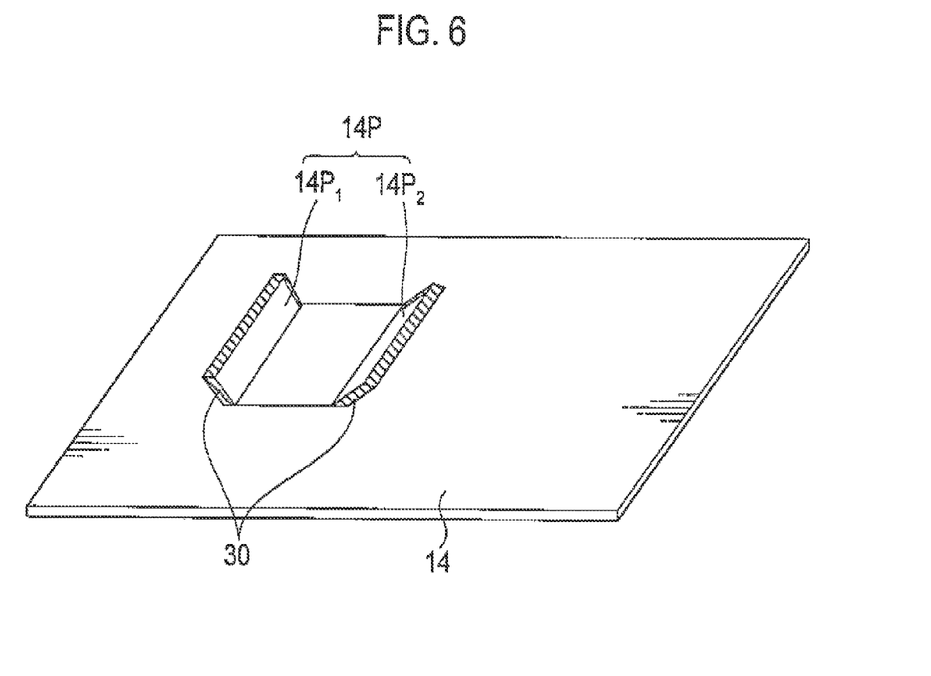
FIG. 6 is another perspective view to illustrate a manufacturing method of the solar cell module 100 according to the first embodiment of the invention.

Next, as shown in FIG. 6, insulating treatment is performed on the metal layer 14b exposed to the surface of each of the pair of movable portions 14P. Specifically, the insulation tape 30 is attached along respective outer circumferences of the pair of movable portions 14P.

Figure 7:
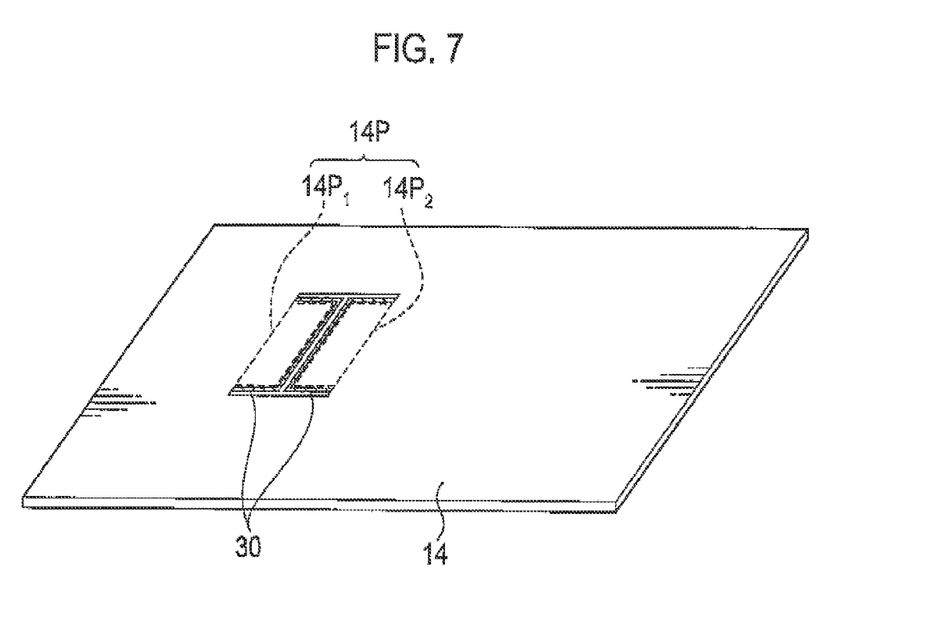
FIG. 7 is another perspective view to illustrate a manufacturing method of the solar cell module 100 according to the first embodiment of the invention.

Next, as shown in FIG. 7, each of the pair of movable portions 14P is closed.

Figure 8:
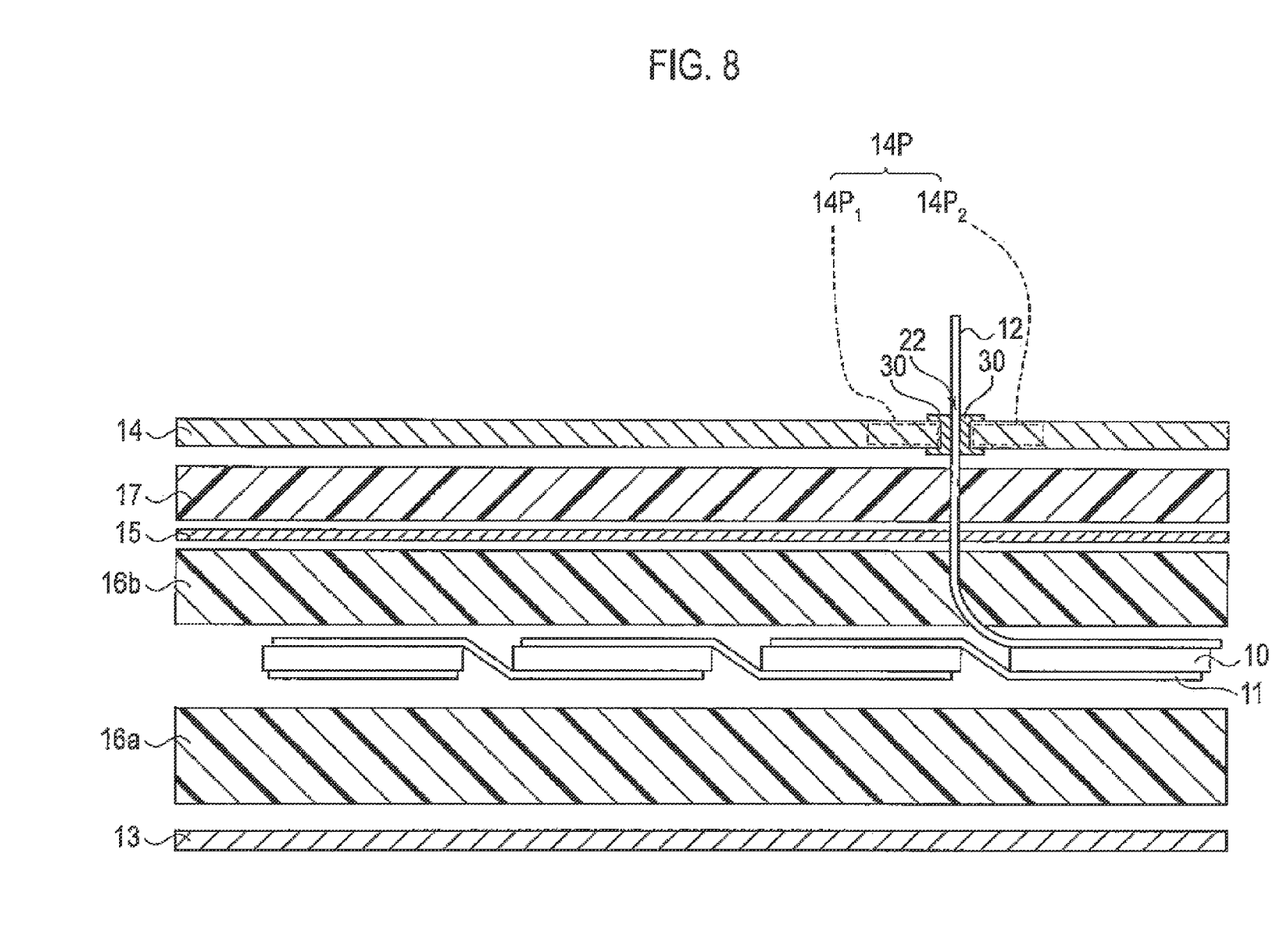
FIG. 8 is another perspective view to illustrate a manufacturing method of the solar cell module 100 according to the first embodiment of the invention.

Next, as shown in FIG. 8, a laminated body is formed by sequentially laminating the light-receiving-surface-side protection member 13, the first sealing member 16a, the plurality of solar cells 10, the first sealing member 16b, the internal separation member 15, the second sealing member 17, and the rear-surface-side protection member 14. During this formation, the other end of the output lead 12 is drawn out from between the pair of movable portions 14P, i.e., from the second slit 22.

Next, the first sealing member 16 and the second sealing member 17 are cured by lamination to form a laminated body under a predetermined condition in a vacuum atmosphere.

[Operation and Effect]

The manufacturing method of the solar cell module 100 according to the embodiment includes the steps of forming the pair of the first slits 21 and the second slit 22 on the rear-surface-side protection member 14; opening each of the pair of movable portions 14P; and performing insulating treatment on the metal layer 14b exposed to the surface of each of the pair of movable portions 14P.

Accordingly, the insulating treatment can be performed on the second slit 22 through which the output lead 12 is drawn out before lamination to form a laminated body. Thus, it is possible to manufacture a solar cell module capable of securing electrical insulation between the metal layer 14b of the rear-surface-side protection member and the output lead 12.

Also, since the insulating treatment can be performed on the metal layer 14b with the pair of movable portions 14P open, the accuracy in performing the insulating treatment as well as the workability of the insulating treatment can be improved. As a result, the productivity of the solar cell module 100 can be improved.

Also, in the manufacturing method of the solar cell module 100 according to the embodiment, the insulating treatment is performed on the metal layer 14b by attaching the insulation tape 30 to the metal layer 14b of a pair of movable portions 14P. Accordingly, the insulating treatment can be easily performed on the metal layer 14b, thus the productivity of the solar cell module 100 can be further improved.

[Other Embodiments]

Although the invention has been described according to the embodiments described above, it should be understood that the description and drawings which form part of the disclosure are not intended to limit the invention. Various alternative embodiments, implementation examples, and application techniques will be apparent to those skilled in the art.

For example, in the above embodiment, one example has been used to describe the configuration of the solar cell module, however, the invention is not limited to this example. For example, the solar cell module 100 may not be provided with the internal separation member 15. Also, the solar cell module 100 may be provided with thin-film solar cells laminated on the light-receiving-surface-side protection member 13 in replace of crystalline solar cells 10 described above.

Although the following has not been mentioned in the above embodiment, a wiring member for bypass diode connection may be drawn out along with the output lead 12 from the second slit 22.

Also, in the above embodiment, insulating treatment is performed on the metal layer 14b exposed to the surface of each of the pair of movable portions 14P, but the insulating treatment needs to be performed on only a part of the metal layer 14b, the part coming into contact with the output lead 12.

In the above embodiment, the pair of first slits 21 and the second slit 22 are both linearly formed, but the invention is not limited to this case. For example, each of the pair of the first slits 21 and the second slit 22 may be formed in a curved or a zigzag shape. The planar shape of the pair of movable portions 14P may be modified according to the shape of the pair of the first slits 21 and the second slit 22.

In the above embodiment, the rear-surface-side protection member 14 has a configuration in which the metal layer is sandwiched between two resin layers, but the invention is not limited to this configuration. For example, the rear-surface-side protection member 14 may have three or more resin layers and may have two or more metal layers.

Thus, it should be understood that the invention includes various embodiments not specifically described herein. Accordingly, the technical scope of the invention should be defined only by the specifications of the invention according to the claims based on the above description.

What is claimed is:

1. A solar cell module comprising:
   a light-receiving-surface-side protection member,
   a rear-surface-side protection member comprising a metal layer sandwiched between first and second opposing resin layers,
   a plurality of solar cells having front and rear surfaces arranged between the light-receiving-surface-side protection member and the rear-surface-side protection member,
   a sealing member disposed between the rear surface of the solar cell and the rear-surface-side protection member, and
   an output lead connected to the solar cells, wherein
   the rear-surface-side protection member includes a first portion and a second portion,
   the first portion partially is surrounded by a first slit, a second slit arranged in parallel to the first slit, and a third slit perpendicularly arranged to the first slit and the second slit, wherein the first, second and third slits define an outer region comprising the first and second opposing resin layers surrounding the metal layer, the metal layer having an edge portion that is exposed to the first, second and third slits,
   the second portion partially is surrounded by a fourth slit, a fifth slit arranged in parallel to the fourth slit, and the third slit perpendicularly arranged to the fourth slit and the fifth slit, wherein the third, fourth and fifth slits define an outer region comprising the first and second opposing resin layers surrounding the metal layer, the metal layer having an edge portion that is exposed to the third, fourth and fifth slits,
   the output lead passes through the sealing member and is drawn out through the third slit, the output lead being adjacent to the exposed edge portion of the metal layer in the first and second portion outer regions and
   film insulating members located on the first portion outer region and the second portion outer region, the film insulating members surrounding the exposed edge portion of the metal layers in the first and second portion outer regions and positioned completely between the output lead and the exposed edge portions of the metal layer in the first and second portion outer regions.

2. The solar cell module according to claim 1, wherein the film members are insulation tapes.

3. The solar cell module according to claim 2, wherein the rear-surface-side protection member comprises a light-receiving surface and a rear-surface-side and the insulation tape is attached across the light-receiving-surface-side of the rear-surface-side protection member through to the rear-surface-side thereof.

4. The solar cell module according to claim 1, wherein the solar cell module includes an internal separation member between the plurality of solar cells and the rear-surface-side protection member.

* * * * *